(12) United States Patent
Han et al.

(10) Patent No.: US 10,059,875 B2
(45) Date of Patent: Aug. 28, 2018

(54) PEROVSKITE PHOTOELECTRIC FUNCTIONAL MATERIAL MODIFIED WITH AMPHIPATHIC MOLECULE, AND METHODS FOR PREPARING AND USING THE SAME

(71) Applicant: Huazhong University of Science and Technology, Wuhan (CN)

(72) Inventors: Hongwei Han, Wuhan (CN); Anyi Mei, Wuhan (CN)

(73) Assignee: WONDER SOLAR LIMITED LIABILITY COMPANY, Ezhou (CN)

(*) Notice: Subject to any disclaimer, the term of this patent is extended or adjusted under 35 U.S.C. 154(b) by 183 days.

(21) Appl. No.: 14/979,477

(22) Filed: Dec. 27, 2015

(65) Prior Publication Data

US 2016/0137915 A1 May 19, 2016

Related U.S. Application Data

(63) Continuation-in-part of application No. PCT/CN2014/073653, filed on Mar. 19, 2014.

(30) Foreign Application Priority Data

Jan. 21, 2014 (CN) .......................... 2014 1 0027583

(51) Int. Cl.
| | | |
|---|---|---|
| C09K 9/02 | (2006.01) | |
| C01G 3/00 | (2006.01) | |
| H01L 51/42 | (2006.01) | |
| C01G 21/00 | (2006.01) | |
| C01G 19/00 | (2006.01) | |
| C01G 17/00 | (2006.01) | |
| H01L 51/56 | (2006.01) | |
| H01L 31/0256 | (2006.01) | |

(52) U.S. Cl.
CPC ................ *C09K 9/02* (2013.01); *C01G 3/006* (2013.01); *C01G 17/006* (2013.01); *C01G 19/006* (2013.01); *C01G 21/006* (2013.01); *H01L 51/422* (2013.01); *C01P 2002/34* (2013.01); *C01P 2006/40* (2013.01); *C09K 2211/10* (2013.01); *H01L 51/4226* (2013.01); *H01L 51/56* (2013.01); *H01L 2031/0344* (2013.01); *H01L 2251/303* (2013.01); *Y02E 10/549* (2013.01)

(58) Field of Classification Search
CPC ...... C09K 9/02; C09K 2211/10; C01G 3/006; C01G 17/006; C01G 19/006; H01L 51/422; H01L 51/4226; H01L 51/56; H01L 2031/0344; H01L 2251/303; C01P 2002/34; C01P 2006/40; Y02E 10/549
USPC .......................................................... 252/500
See application file for complete search history.

(56) References Cited

U.S. PATENT DOCUMENTS

| | | | | |
|---|---|---|---|---|
| 5,871,579 A * | 2/1999 | Liang | ........................ | C23C 2/04 117/54 |
| 6,429,318 B1 * | 8/2002 | Mitzi | ................ | H01L 21/31691 117/68 |

* cited by examiner

*Primary Examiner* — Harold Y Pyon
*Assistant Examiner* — Danny N Kang
(74) *Attorney, Agent, or Firm* — Matthias Scholl, PC; Mathias Scholl

(57) ABSTRACT

A perovskite-based photoelectric functional material having a general formula $M_zA_yBX_{z+y+2}$. The matrix of the photoelectric functional material is a perovskite material $ABX_3$, M is an organic amphipathic molecule used as a modification component of the matrix, $0<z\leq0.5$, $0<y\leq1$, and $y+z\geq1$.

6 Claims, No Drawings

PEROVSKITE PHOTOELECTRIC FUNCTIONAL MATERIAL MODIFIED WITH AMPHIPATHIC MOLECULE, AND METHODS FOR PREPARING AND USING THE SAME

CROSS-REFERENCE TO RELATED APPLICATIONS

This application is a continuation-in-part of International Patent Application No. PCT/CN2014/073653 with an international filing date of Mar. 19, 2014, designating the United States, now pending, and further claims priority benefits to Chinese Patent Application No. 201410027583.7 filed Jan. 21, 2014. The contents of all of the aforementioned applications, including any intervening amendments thereto, are incorporated herein by reference.

BACKGROUND OF THE INVENTION

Field of the Invention

The invention relates to a perovskite-based photoelectric functional material $M_zA_yBX_{z+y+2}$ and a preparation method thereof.

Description of the Related Art $ABX_3$-structured perovskite materials have aroused increasing attention due to its unique crystal structure and high photovoltaic conversion efficiency.

However, conventional $ABX_3$-structured perovskite materials prepared by a full-solution method have defective crystal form, which greatly restricts the efficiency and stability of perovskite solar cells. Although the methods like vacuum vapor deposition favor the control of crystallization, the cost is increased.

SUMMARY OF THE INVENTION

In view of the above-mentioned problems, it is an objective of the invention to provide a perovskite-based photoelectric functional material modified with an organic amphipathic molecule. This material has excellent photovoltaic performance and high stability and can be easily prepared from a wide source of low-cost raw materials. Also, it is advantageous in improving efficiency and stability of solar cells in the field of perovskite-based solar cells.

To achieve the above objective, according to one embodiment of the present invention, there is provided a perovskite-based photoelectric functional material modified with an organic amphipathic molecule, expressed by a general formula $M_zA_yBX_{z+y+2}$, M is an organic amphipathic molecule used as a modification component with a perovskite material $ABX_3$ as a matrix.

In a class of this embodiment, the organic amphipathic molecule M is expressed by R1-R—R2, R1 is selected from a group consisting of —$NH_2$, —NH—C($NH_2$)=NH and —N=CH—$NH_2$.

In a class of this embodiment, R2 in the organic amphipathic molecule R1-R—R2 is selected from a group consisting of —COOH, —OSiOH, —$O_3$POH and —$O_2$SOH.

In a class of this embodiment, R in the organic amphipathic molecule R1-R—R2 is an organic group and could be selected from a group consisting of linear alkyl, branched alkyl and halogenated alkyl of C1-C30, cycloalkyl of C3-C12, heterocycle of C1-C12, alkenyl of C2-C8, alkynyl of C2-C8, aryl of C6-C12, aralkyl of C6-C30, alkylaryl of C6-C30, heteroaryl of C1-C12, alkyl heteroaryl of C6-C30 and alkyl heterocycle of C6-C30.

In a class of this embodiment, A is selected from a group consisting of methylamine, formamidine and cesium preferably.

In a class of this embodiment, B is selected from a group consisting of lead, tin, copper and germanium.

In a class of this embodiment, X is selected from a group consisting of chlorine, bromine and iodine.

According to another embodiment of the present invention, there is provided an application of the perovskite-based photoelectric functional material modified with an organic amphipathic molecule in solar cells, the perovskite-based photoelectric functional material is used as a light absorption layer, n-type or p-type materials.

According to another embodiment of the present invention, there is provided an application of the perovskite-based photoelectric functional material modified with an organic amphipathic molecule in other fields such as LEDs and electronic devices.

According to another embodiment of the present invention, there is provided a preparation method of the perovskite-based photoelectric functional material, the method comprising:

(1) contacting an amphipathic molecule with halogen acid to yield a halate;

(2) contacting an appropriate amount of said halate and methylamine iodide with $PbI_2$ to yield a perovskite precursor solution; and (3) drying said perovskite precursor solution to yield said perovskite-based photoelectric functional material.

Advantageously, the perovskite precursor solution is obtained by adding an appropriate amount of γ-butyrolactone into iodate, methylamine iodide and $PbI_2$ with a certain molar ratio and stirring the mixture for fully reaction.

A significant advantage of the invention is: promoting crystalline morphology of a perovskite material $ABX_3$ by using organic amphipathic molecules that are low cost and have extensive sources to greatly improve the crystallization performance, which induced an increased photoelectric conversion efficiency and stability of perovskite material-based solar cells significantly.

The material of the invention has excellent photovoltaic properties and high stability and can be prepared by a simple method with simple apparatuses from raw materials that are low cost and have extensive sources.

As M is 4-aminobutyric acid, A is methylamine, B is lead, X is chlorine, x is 0.1, and y is 0.95, carbon-materials-based counter electrode mesoscopic solar cells that used $M_xA_y$-$BX_{x+y+2}$ show excellent stability, and the photovoltaic conversion efficiency can reach up to 11%, far greater than that of solar cells in the same kind. The photoelectric functional material $M_xA_yBX_{x+y+2}$ of the invention has a greater prospect for industrial applications compared with the existing perovskite material $ABX_3$.

Prepared by a full-solution method, the photoelectric functional material modified with an organic amphipathic molecule with a perovskite material $ABX_3$ as the matrix of the invention is far superior to an unmodified material in photovoltaic conversion efficiency and stability, and crystalizing performance when applied it to solar cells. Under the same circumstance, applying the photoelectric functional material $M_xA_yBX_{x+y+2}$ to carbon-materials-based counter electrode mesoscopic solar cells results in higher photovoltaic conversion efficiency and stability than applying the unmodified material $ABX_3$ to solar cells in the same kind.

DETAILED DESCRIPTION OF THE EMBODIMENTS

For further illustrating the invention, experiments detailing a perovskite-based photoelectric functional material $M_zA_yBX_{z+y+2}$ and a preparation method thereof are described below. It should be noted that the following examples are intended to describe and not to limit the invention.

According to one embodiment of the invention, there is provided a perovskite-based photoelectric functional material modified with an organic amphipathic molecule, expressed by a general formula $M_zA_yBX_{z+y+2}$, where M is an organic amphipathic molecule used as a modification component with a perovskite material $ABX_3$ as a matrix.

The organic amphipathic molecule M is expressed by R1-R—R2, R1 is selected from a group consisting of —$NH_2$, —NH—C($NH_2$)=NH and —N=CH—$NH_2$, and R2 is selected from a group consisting of —COOH, —OSiOH, —$O_3$POH and —$O_2$SOH.

In this embodiment, R is an organic group and is selected from a group consisting of linear alkyl, branched alkyl and halogenated alkyl of C1-C30, cycloalkyl of C3-C12, heterocycle of C1-C12, alkenyl of C2-C8, alkynyl of C2-C8, aryl of C6-C12, aralkyl of C6-C30, alkylaryl of C6-C30, heteroaryl of C1-C12, alkyl heteroaryl of C6-C30 and alkyl heterocycle of C6-C30.

In this embodiment, A is selected from a group consisting of methylamine, formamidine and cesium preferably.

In this embodiment, B is selected from a group consisting of lead, tin, copper and germanium preferably.

In this embodiment, X is selected from a group consisting of chlorine, bromine and iodine preferably.

In the photoelectric functional material $M_xA_yBX_{x+y+2}$, $0<z\leq 0.5$, $0<y\leq 1$, and $y+z\geq 1$, and $z=0.01$-$0.1$ and $y=0.95$-$1$ preferably.

When no amphipathic molecule is introduced, monovalent ions such as short-chained amine cations (such as methylamine and formamidine) and cesium ions enter gaps among co-vertex connected octahedrons of a metal halide $BX_2$ to form a 3D perovskite material. When an amphipathic molecule is introduced, short-chained amine cations or cesium ions enter gaps among co-vertex connected octahedrons of the metal halide to form 3D perovskite layers (thickness of each perovskite layer is determined by molar ratio between the amphipathic molecule and the monovalent ion), and an organic layer is generated between every two 3D perovskite layers to obtain a modified perovskite material with perovskite layers and organic layers overlapped alternatively. Film quality in a large area and stability of the material is significantly improved and photovoltaic properties thereof are optimized due to the existence of organic amphipathic molecules.

According to one embodiment of the invention, there is provided a preparation method of a perovskite-based photoelectric functional material modified with an organic amphipathic molecule, comprising steps of:

1) Obtaining a halate by an amphipathic molecule reacting with halogen acid; Specifically and preferably, an iodate is obtained by an amphipathic molecule M fully reacting with hydroiodic acid into an ice-water bath, rotary evaporation, and washing the precipitate with diethyl ether.

2) Obtaining a perovskite precursor solution by an appropriate amount of the halate and methylamine iodide reacting with $PbI_2$;

Specifically and preferably, a precursor solution is obtained by adding an appropriate amount of γ-butyrolactone into iodate, methylamine iodide and $PbI_2$ weighted respectively by molar ratio and stirring the mixture for fully reaction.

3) Drying the perovskite precursor solution thereby obtaining the perovskite-based photoelectric functional material.

Example 1

In this example, an amphipathic molecule 4-aminobutyric acid (GABA) is fully reacted with hydroiodic acid into an ice-water bath with a molar ratio of 1:1. After rotary evaporation, the precipitate is washed by diethyl ether thoroughly and the (GABA)I powder is obtained. Then, (GABA)I, methylamine iodide and $PbI_2$ are mixed with a molar ratio of 0.1:0.95:1 and an appropriate amount of γ-butyrolactone is added and stirred for fully reaction to obtain the $(GABA)_{0.1}MA_{0.95}PbI_{3.05}$ precursor solution. An appropriate amount of the precursor solution is filled into a carbon-materials-based counter electrode mesoscopic solar cell and dried at 50° C. and photovoltaic conversion efficiency of the solar cell is up to 11%.

Example 2

In this example, an amphipathic molecule 4-aminobutyric acid (GABA) is fully reacted with hydrochloric acid into an ice-water bath with a molar ratio of 1:1. After rotary evaporation, the precipitate is washed by diethyl ether thoroughly and the (GABA)Cl powder is obtained. Then, (GABA)Cl, methylamine iodide and $PbI_2$ are mixed with a molar ratio of 0.06:0.97:1 and an appropriate amount of DMF is added and stirred for fully reaction to obtain the $(GABA)_{0.06}MA_{0.97}PbI_{2.97}Cl_{0.06}$ precursor solution. An appropriate amount of the precursor solution is filled into a carbon-materials-based counter electrode mesoscopic solar cell and dried at 70° C. and photovoltaic conversion efficiency of the solar cell is up to 11%.

Example 3

In this example, an amphipathic molecule 4-aminobutyric acid (GABA) is fully reacted with hydroiodic acid into an ice-water bath with a molar ratio of 1:1. After rotary evaporation, the precipitate is washed by diethyl ether thoroughly and the (GABA)I powder is obtained. Then, (GABA)I, methylamine bromide and $PbI_2$ are mixed with a molar ratio of 0.1:0.95:1 and an appropriate amount of γ-butyrolactone is added and stirred for fully reaction to obtain the $(GABA)_{0.1}MA_{0.95}PbI_{2.1}Br_{0.95}$ precursor solution. An appropriate amount of the precursor solution is filled into a carbon-materials-based counter electrode mesoscopic solar cell and dried at 60° C. and photovoltaic conversion efficiency of the solar cell is up to 9.8%.

In the above examples, the amphipathic molecule is not limited to 4-aminobutyric acid and can also be other material, such as 6-aminocaproic acid, HOOC—$CH_2$—CH=CH—$CH_2$—$NH_2$, 4-guanidinobutyric acid or sulfanilic acid. Generally, M is expressed by R1-R—R2, R1 is selected from the group consisting of —$NH_2$, —NH—C($NH_2$)=NH and —N=CH—$NH_2$, R2 is selected from the group consisting of —COOH, —OSiOH, —$O_3$POH and —$O_2$SOH, and R is an organic group.

Besides, methylamine iodide can be replaced by chloride methylamine or bromide methylamine, $PbI_2$ can be replaced by lead bromide, lead chloride, germanium iodide or tin iodide, and molar ratio is not limited to the above values as long as $0<z\leq 0.5$, $0<y\leq 1$ and $y+z\geq 1$.

The perovskite-based photoelectric functional material of the invention can be used in a solar cell as a light absorption layer, n-type or p-type materials, and can also be used in LEDs or electronic devices as a semiconductor material.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A photoelectric material, having a general formula $M_zA_yBX_{z+y+2}$, wherein:
   a matrix of the photoelectric functional material is a perovskite material $ABX_3$;
   A is a monovalent ion;
   B is a divalent metal ion;
   X is a halide ion;
   $0<z\leq0.5$;
   $0<y\leq1$;
   $y+z\geq1$; and
   M is an organic amphipathic molecule used as a modification component of the matrix, and has a formula of $R^1$—R—$R^2$, wherein $R^1$ is selected from the group consisting of —$NH_2$, —NH—C($NH_2$)=NH and —N=CH—$NH_2$, $R^2$ is selected from the group consisting of —COOH, —OSiOH, —$O_3$POH and —$O_2$SOH, and R is an organic group.

2. The material of claim 1, wherein A is an organic amine cation or an alkali metal ion, and A is selected from the group consisting of methylammonium ion, formamidine ion, and cesium ion.

3. The material of claim 1, wherein B is selected from the group consisting of lead, tin, copper and germanium.

4. The material of claim 2, wherein B is selected from the group consisting of lead, tin, copper and germanium.

5. The material of claim 1, wherein R is selected from the group consisting of linear alkyl, branched alkyl and halogenated $C_{1-30}$-alkyl, $C_{3-12}$-cycloalkyl, $C_{1-12}$-heterocycle, $C_{2-8}$-alkenyl, $C_{2-8}$-alkynyl, $C_{6-12}$-aryl, $C_{6-30}$-aralkyl, $C_{6-30}$-alkylaryl, $C_{1-12}$-heteroaryl, $C_{6-30}$-alkyl heteroaryl and $C_{6-30}$-alkyl heterocycle.

6. The material of claim 1, wherein X is selected from the group consisting of chlorine, bromine and iodine.

* * * * *